US012604735B2

(12) United States Patent
Raghunathan et al.

(10) Patent No.: US 12,604,735 B2
(45) Date of Patent: Apr. 14, 2026

(54) DEVICE WITH AIRGAP STRUCTURE

(71) Applicant: GLOBALFOUNDRIES U.S. Inc., Malta, NY (US)

(72) Inventors: Uppili S. Raghunathan, Essex Junction, VT (US); Vibhor Jain, Williston, VT (US); Siva P. Adusumilli, South Burlington, VT (US); Yves T. Ngu, Williston, VT (US); Johnatan A. Kantarovsky, South Burlington, VT (US); Sebastian T. Ventrone, South Burlington, VT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 871 days.

(21) Appl. No.: 17/707,273

(22) Filed: Mar. 29, 2022

(65) Prior Publication Data

US 2023/0317627 A1      Oct. 5, 2023

(51) Int. Cl.
| | |
|---|---|
| *H01L 23/552* | (2006.01) |
| *H01L 21/764* | (2006.01) |
| *H10D 10/80* | (2025.01) |
| *H10D 62/10* | (2025.01) |

(52) U.S. Cl.
CPC .......... *H01L 23/552* (2013.01); *H01L 21/764* (2013.01); *H10D 10/821* (2025.01); *H10D 62/115* (2025.01)

(58) Field of Classification Search
CPC combination set(s) only.
See application file for complete search history.

(56) References Cited

U.S. PATENT DOCUMENTS

| | | | |
|---|---|---|---|
| 6,297,119 | B1 | 10/2001 | Tsutsui et al. |
| 6,365,447 | B1 | 4/2002 | Hebert et al. |
| 7,303,968 | B2 | 12/2007 | Dunn et al. |
| 7,936,041 | B2 | 5/2011 | Johnson et al. |
| 9,029,229 | B2 | 5/2015 | Adkisson et al. |
| 9,159,817 | B2 | 10/2015 | Camillo-Castillo et al. |
| 9,368,608 | B1 | 6/2016 | Camillo-Castillo et al. |
| 9,653,566 | B2 | 5/2017 | Camillo-Castillo et al. |
| 9,722,057 | B2 | 8/2017 | Camillo-Castillo et al. |
| 10,388,728 | B1 | 8/2019 | Zierak et al. |
| 10,446,643 | B2 | 10/2019 | Adusumilli et al. |
| 10,692,753 | B2 | 6/2020 | Jaffe et al. |

(Continued)

OTHER PUBLICATIONS

Search Report in related EP Application No. 22200004.4-1211 / 4254476 dated Sep. 13, 2023, 8 pages.

(Continued)

*Primary Examiner* — Mark W Tornow
*Assistant Examiner* — Priya M Rampersaud
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to devices with airgap structures and methods of manufacture. The structure includes: a semiconductor substrate with a trap-rich region; one or more airgap structures within the semiconductor substrate; at least one deep trench isolation structure laterally surrounding the one or more airgap structures and extending into the semiconductor substrate; and a device over the one or more airgap structures.

14 Claims, 8 Drawing Sheets

(56) References Cited

U.S. PATENT DOCUMENTS

| | | | |
|---|---|---|---|
| 10,903,316 B2 | 1/2021 | Stamper et al. | |
| 11,016,055 B2 | 5/2021 | Campanella-Pineda et al. | |
| 11,056,382 B2 | 7/2021 | Adusumilli et al. | |
| 11,271,077 B2 | 3/2022 | Stamper et al. | |
| 2010/0283084 A1* | 11/2010 | Ohnishi | H01L 29/1004 |
| | | | 438/312 |
| 2011/0127615 A1 | 6/2011 | Tanaka | |
| 2015/0145043 A1 | 5/2015 | Huang et al. | |
| 2016/0071925 A1 | 3/2016 | Jaffe et al. | |
| 2017/0170056 A1 | 6/2017 | Jaffe et al. | |
| 2018/0083098 A1 | 3/2018 | Goktepeli | |
| 2018/0166324 A1 | 6/2018 | Schaeffer et al. | |
| 2019/0013382 A1 | 1/2019 | Stamper et al. | |
| 2019/0081138 A1* | 3/2019 | Liu | H10D 86/01 |
| 2019/0139819 A1* | 5/2019 | Jaffe | H10D 62/115 |
| 2019/0229185 A1 | 7/2019 | Adusumilli et al. | |
| 2019/0312142 A1 | 10/2019 | Adusumilli et al. | |
| 2020/0219760 A1 | 7/2020 | Kantarovsky et al. | |
| 2021/0091180 A1* | 3/2021 | Pekarik | H10D 62/822 |
| 2021/0257454 A1 | 8/2021 | Adusumilli et al. | |
| 2022/0190108 A1* | 6/2022 | Rana | H10D 62/116 |

OTHER PUBLICATIONS

Notice of Allowance dated Apr. 18, 2024 in related U.S. Appl. No. 17/157,269, 10 pages.

Ildefonso et al., "Comparison of Single-Event Transients in SiGe HBTs on Bulk and Thick-Film SOI", IEEE Transactions on Nuclear Science, vol. 67, Issue 1, Jan. 2020, Abstract, 2 pages.

Specification and Drawings for U.S. Appl. No. 17/157,269, filed Jan. 25, 2021, 33 pages.

Final Office Action dated Jan. 30, 2024 in related U.S. Appl. No. 17/157,269, 17 pages.

Response to Final Office Action dated Mar. 20, 2024 in related U.S. Appl. No. 17/157,269, 10 pages.

* cited by examiner

DEVICE WITH AIRGAP STRUCTURE

BACKGROUND

The present disclosure relates to semiconductor structures and, more particularly, to devices with airgap structures and methods of manufacture.

High radiation environments, including the upper atmosphere, near-earth orbit, outer space, and certain terrestrial environments (e.g., proximity to devices producing significant amounts of radiation) provide hostile environments for reliable operation of microelectronic solid-state devices. Exposure to radiation causes electrical degradation of both transistors and circuit-isolation elements, which can lead to sporadic device behavior and/or complete destructive failure of integrated circuits (ICs). For example, charge generation caused by a heavy ion or a high energy photon manifests itself as a single event transient in electrical terminals of devices and integrated circuits operating under extreme radiation environments, which can lead to complete failure of the device.

SUMMARY

In an aspect of the disclosure, a structure comprising: a semiconductor substrate comprising a trap-rich region; at least one airgap structure within the semiconductor substrate; at least one deep trench isolation structure laterally surrounding the at least one airgap structure and extending into the semiconductor substrate; and a device over the at least one airgap structure.

In an aspect of the disclosure, a structure comprises: a semiconductor substrate comprising a trap-rich region of amorphous semiconductor material; shallow trench isolation structures above the trap-rich region; deep trench isolation structures extending into the semiconductor substrate to a depth below the shallow trench isolation structures; at least one airgap structure bounded by the deep trench isolation structures; and a device above the at least one airgap structure and the trap rich region.

In an aspect of the disclosure, a method comprises: forming a semiconductor substrate comprising a trap-rich region; forming at least one airgap structure within the semiconductor substrate; forming at least one deep trench isolation structure laterally surrounding the at least one airgap structure and extending into the semiconductor substrate; and forming a device over the at least one airgap structure.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to devices with airgap structures and methods of manufacture. More specifically, the devices (or circuits) may include full or partial airgap structures located in a trap-rich region under an active or passive device. The air gap structures may also be surrounded by deep trench isolation structures. Advantageously, the airgap structures reduce charge generation during single event transients (SETs) or single event upset (SEU) for radiation hardened technologies. In addition, the airgap structures reduce transient current time and transient peaks. Also, pillars (e.g., c-Si or a-Si material) supporting material above the airgap structures provide improved thermal contact to the substrate. Moreover, the airgap structures in buried insulator material of semiconductor-on-insulator (SOI) technologies may lessen the effect of charge buildup during total ionizing dose (TID).

In embodiments, the airgap structures may be formed in a trap-region of a substrate between (bounded by) deep trench isolation structures. The airgap structures may also extend below the deep trench isolation structures. The trap-rich region may also be under shallow trench isolation structures. The trap-rich region may be semiconductor material, i.e., Si material with defects. In addition, the airgap structures may be a plurality of airgap structures within the trap-rich region, with portions of the trap-rich region separating the airgap structures from one another and forming pillars used to connect active device regions to the underlying substrate. The pillars may also be used to increase heat flow. The airgap structures may be directly below the devices. Amongst other advantages, the combination of the trap-rich region and airgap structures will reduce the amount of charge generation to improve the settling time of transient currents that cause bit errors in high-speed digital circuits.

The devices of the present disclosure can be manufactured in a number of ways using a number of different tools. In general, though, the methodologies and tools are used to form structures with dimensions in the micrometer and nanometer scale. The methodologies, i.e., technologies, employed to manufacture the devices of the present disclosure have been adopted from integrated circuit (IC) technology. For example, the structures are built on wafers and are realized in films of material patterned by photolithographic processes on the top of a wafer. In particular, the fabrication of the devices uses three basic building blocks: (i) deposition of thin films of material on a substrate, (ii) applying a patterned mask on top of the films by photolithographic imaging, and (iii) etching the films selectively to the mask.

Figure 1:
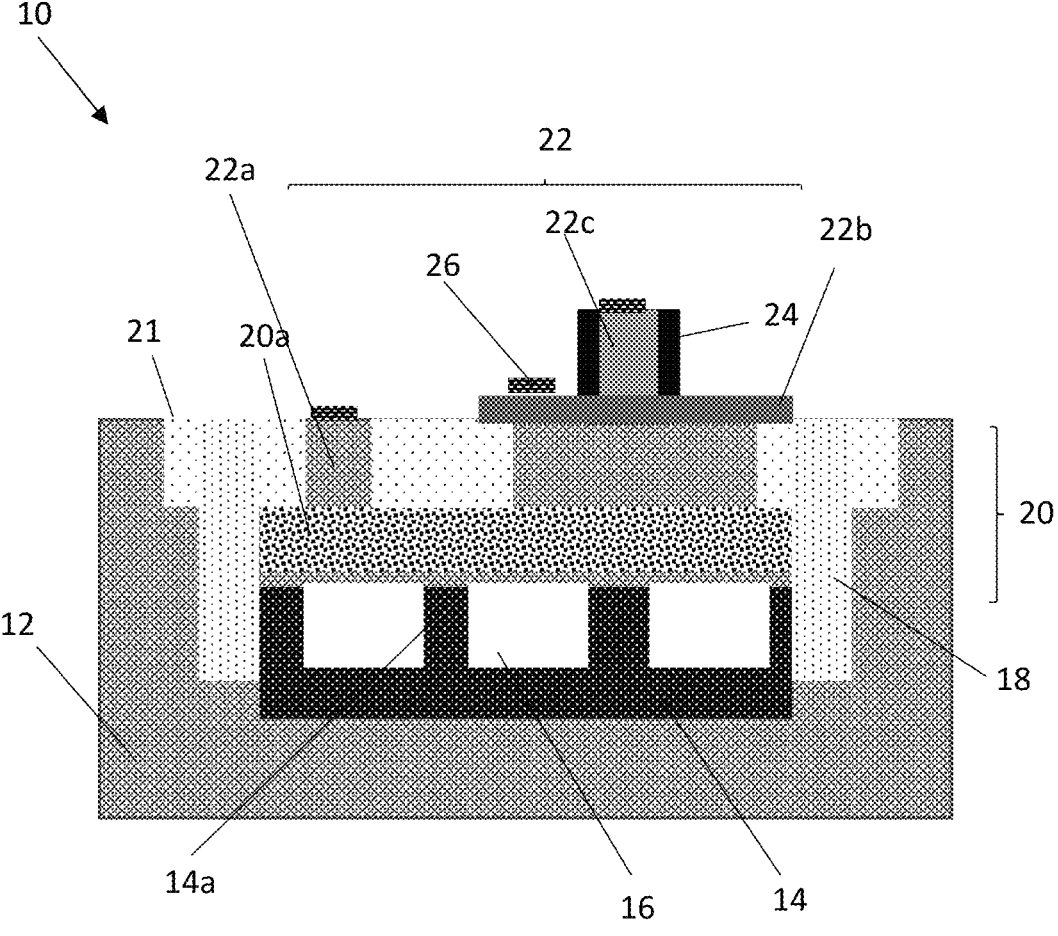
FIG. 1 shows a device with airgap structures and respective fabrication processes in accordance with aspects of the present disclosure.

FIG. 1 shows a device with airgap structures and respective fabrication processes in accordance with aspects of the present disclosure. In particular, the device 10 includes a substrate 12 comprising semiconductor material. For example, the substrate 12 may be a bulk substrate composed of any suitable material including, but not limited to, Si, SiGe, SiGeC, SiC, Ge alloys, GaAs, InAs, InP, and other III/V or II/VI compound semiconductors. In preferred embodiments, the substrate 12 may be a single semiconducting material such as bulk silicon comprising any suitable crystallographic orientation (e.g., a (100), (110), (111), or (001) crystallographic orientation).

A trap-rich region 14 may be provided within the substrate 12. As should be understood by those of skill in the art, the trap-rich region 14 may be used for radiation hardened protection which allows for quick recombination of generated charge. The trap-rich region 14 may be an amorphous semiconductor material such as polysilicon. In further embodiments, the trap-rich region 14 may be composed of Si or other semiconductor material comprising defects. In one exemplary embodiment, the defects may be provided by an implant process using an inert gas, e.g., an argon implant, followed by a thermal anneal as described in more detail with respect to FIG. 4A.

Still referring to FIG. 1, one or more airgap structures 16 may be formed in the trap-rich region 14. In embodiments, the one or more airgap structures 16 may be provided below device 22 and between deep trench isolation structures 18. The airgap structures 16 may be separated and/or isolated by pillars 14a formed of trap-rich material of the trap-rich material 14. The one or more airgap structures 16 may be used to reduce charge generation near the device 22 during an SET or SEU. Also, the pillars 14a may connect to the substrate 12 (e.g., to allow heat flow and additional support to prevent collapse). Generally, the one or more airgap structures 16 may be fabricated using lithography, etching and deposition methods as described in more detail with respect to FIGS. 4B and 4C.

A semiconductor material 20, e.g., Si, may be grown over the one or more airgap structures 16. As described in more detail below, the semiconductor material 20 may be an epitaxial grown semiconductor material used to seal or plug the one or more airgap structures 16 over the trap-rich region 14. The semiconductor material 20 may also include an N+ doped region 20a, which may be used as a subcollector in a heterojunction bipolar transistor application. The N+ doped region 20a may be formed by introducing a dopant by, for example, ion implantation as described in more detail with respect to FIG. 4C. The N+ doped region 20a may comprise n-type dopants, e.g., Arsenic (As), Phosphorus (P) and Sb, among other suitable examples. Also, the one or more airgap structures 16 may be below the N+ doped region 20a, which will reduce charge (e.g., electrode-hole (e/h)) generation from heavy ion bombardment.

Still referring to FIG. 1, the deep trench isolation structures 18 bound (e.g., laterally surrounding) the one or more airgap structures 16 and the trap-rich region 14. In embodiments, the one or more airgap structures 16 and/or the trap-rich region 14 may extend below the deep trench isolation structures 18. The deep trench isolation structures 18 may also extend through the semiconductor material 20 and into the substrate 12. The use of the deep trench isolation structures 18 may provide a compact footprint for the device 22. Shallow trench isolation structures 21 may also be formed in the semiconductor material 20, above the trap-rich region 14 and the airgap structures 16. The deep trench isolation structures 18 and the shallow trench isolation structures 21 can be formed by conventional lithography, etching and deposition methods known to those of skill in the art and as further described with respect to FIG. 4D.

FIG. 1 further shows a device 22 over the one or more airgap structures 16 and the trap-rich region 14. In this implementation, the device 22 may be a heterojunction bipolar transistor; however, it should be understood by one of skill in the art that other active or passive devices over the one or more airgap structures 16 and the trap-rich region 14 are contemplated herein.

In the heterojunction bipolar transistor, a collector 22a is provided with the semiconductor material 20, above the N+ doped region 20a. A base 22b is formed over the semiconductor material 20. In embodiments, the base 22b may comprise SiGe material. An emitter 22c may be formed on the base 22b. In embodiments, the emitter 22c may be N-doped Si material as an example, with sidewall spacers 24. The sidewall spacers 24 may be nitride and/or oxide material formed by conventional deposition processes (e.g., CVD) followed an anisotropic etching process. A silicide contact 26 may be formed on the collector 22a, base 22b and emitter 22c. As should be understood by those of skill in the art, the silicide process may be a NiSi material. A more detailed discussion of the device and silicide formation is provided with respect to FIG. 4E.

Figure 2:
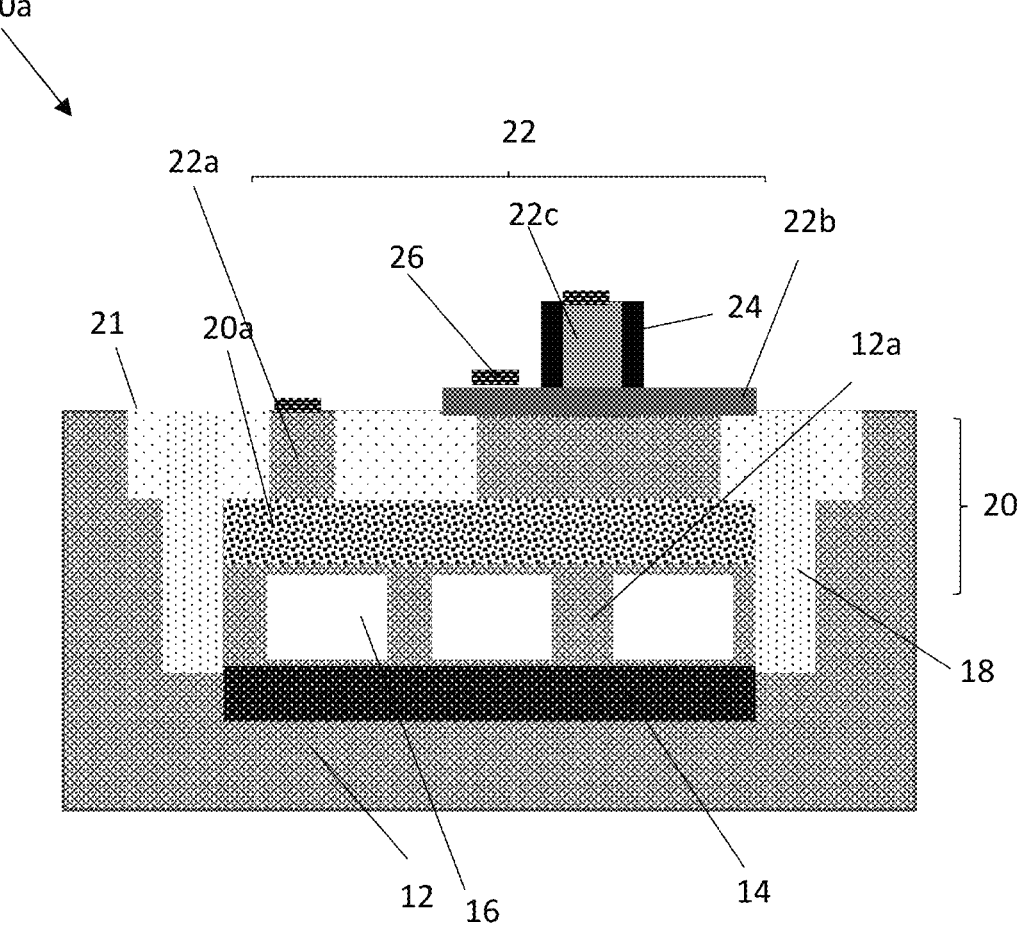
FIG. 2 shows a device with airgap structures and respective fabrication processes in accordance with additional aspects of the present disclosure.

FIG. 2 shows a device with airgap structures in accordance with additional aspects of the present disclosure. In the structure 10a of FIG. 2, the trap-rich region 14 may extend partially (or entirely) below the deep trench isolation structures 18. In addition, in this embodiment, the airgap structures 16 may be above the trap-rich region 14 and within the substrate 12, e.g., single crystalline semiconductor material. The airgap structures 16 may still remain bounded by the deep trench isolation structures 18 and below the device 22. The airgap structures 16 may be separated or isolated by pillars 12a comprising single crystal semiconductor material (e.g., to allow heat flow and add support to prevent collapse).

Figure 3:
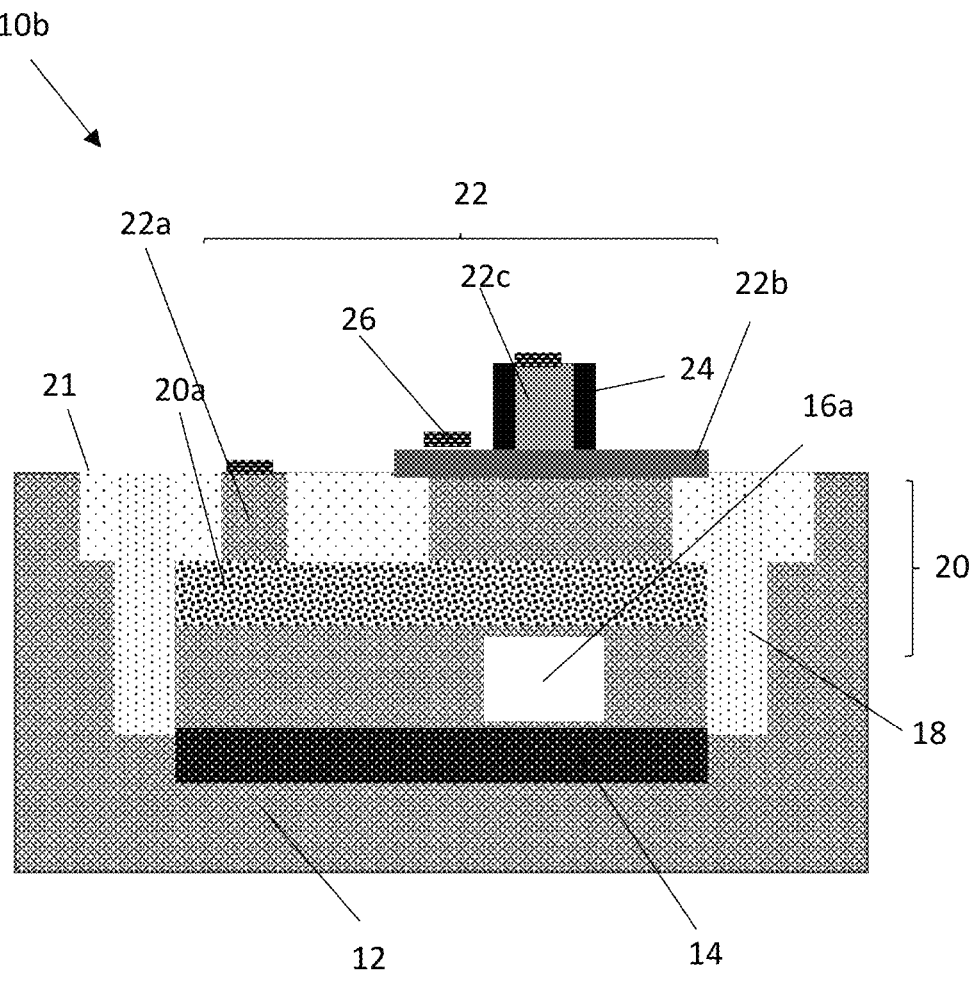
FIG. 3 shows a device with an airgap structure and respective fabrication processes in accordance with further aspects of the present disclosure.

FIG. 3 shows a device with airgap structures in accordance with further aspects of the present disclosure. In the structure 10b of FIG. 3, the trap-rich region 14 may extend partially (or entirely) below the deep trench isolation structures 18. In addition, in this embodiment, a single airgap structure 16a may be above the trap-rich region 14 and within the substrate 12, e.g., single crystalline semiconductor material. The single airgap structure 16a may preferably be only below and aligned with the emitter 22c, and which will still remain bounded by the deep trench isolation structures 18.

FIGS. 4A-4E show fabrication processes for forming the device 10 of FIG. 1. It should be understood by those of skill in the art that similar processes may be used to fabricate the devices of FIGS. 2 and 3.

Figure 4A:
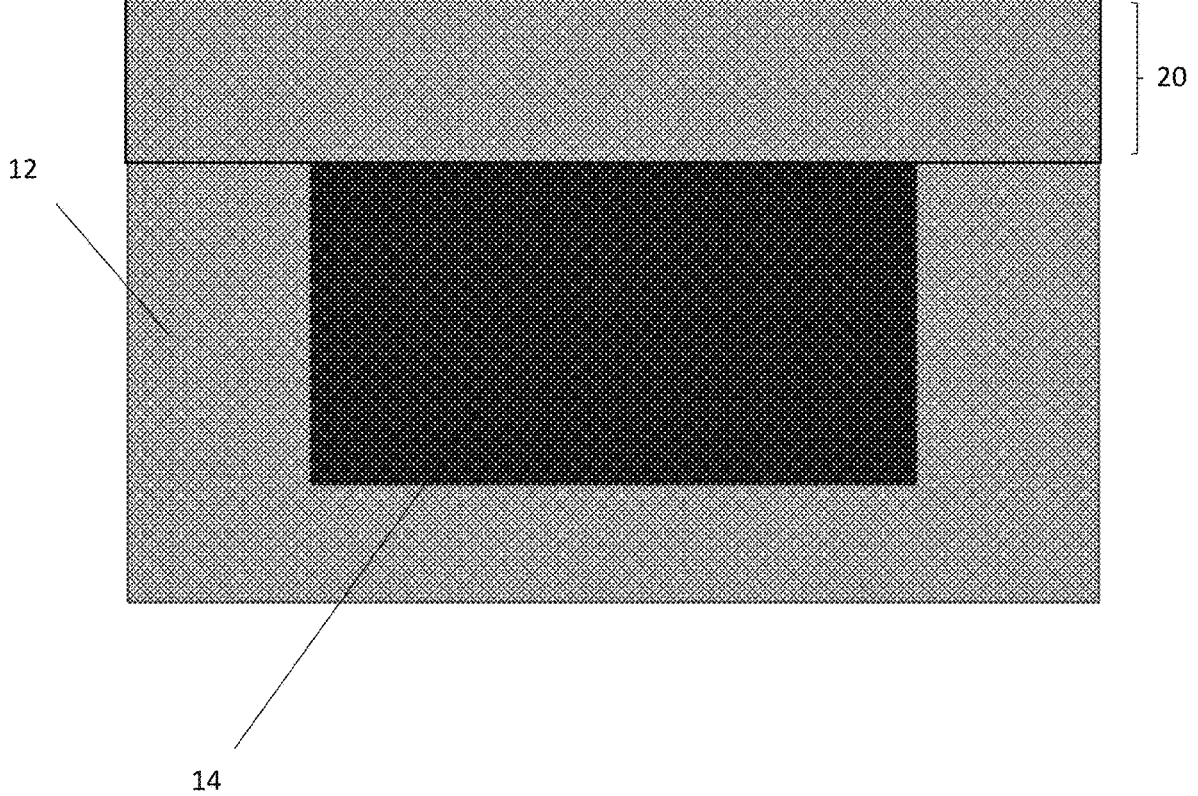
FIGS. 4A-4E show fabrication processes to manufacture the device of FIG. 1 in accordance with aspects of the present disclosure.

Starting at FIG. 4A, a trap-rich region 14 is provided within the substrate 12. In embodiments, the trap-rich region 14 may be an amorphous semiconductor material such as polysilicon. In embodiments, the trap-rich region 14 may be composed of Si or other semiconductor material comprising defects. In one exemplary embodiment, the defects may be provided by an implant process using an inert gas, e.g., an argon implant process at a low dose and energy (e.g., eliminates the need for a standard high energy high dose Argon implant) followed by an anneal process. For example, the argon implant can be at a dose of 30 Kev to 500 Kev (compared to a standard implantation dosage of about 900 Kev), and the energy can be at 1e14 to 1e15 (compared to a standard energy of 1e16). Other implants may be, e.g., xenon (Xe), arsenic (As), or germanium (Ge) which will also increase its etch rate. In one embodiment, the implanted species may be Xe with an implant dose ranging from 4E13 cm−2 to of 1E15 cm−2 and an implant energy ranging from 30 KeV to 200 Kev. In another embodiment, the implanted species may be Ge with an implant dose ranging from 5e13 cm−2 to 2e15 cm−2 and an implant energy ranging from 30 Kev to 200 Kev. In this way, the implant process will damage the substrate 12 resulting in an amorphous Si material, e.g., trap-rich region 14. An epitaxial semiconductor material 20 may be grown over the trap-rich region 14 using conventional epitaxial growth processes as is known in the art such that no further explanation is required for a complete understanding of the present disclosure.

Figure 4B:
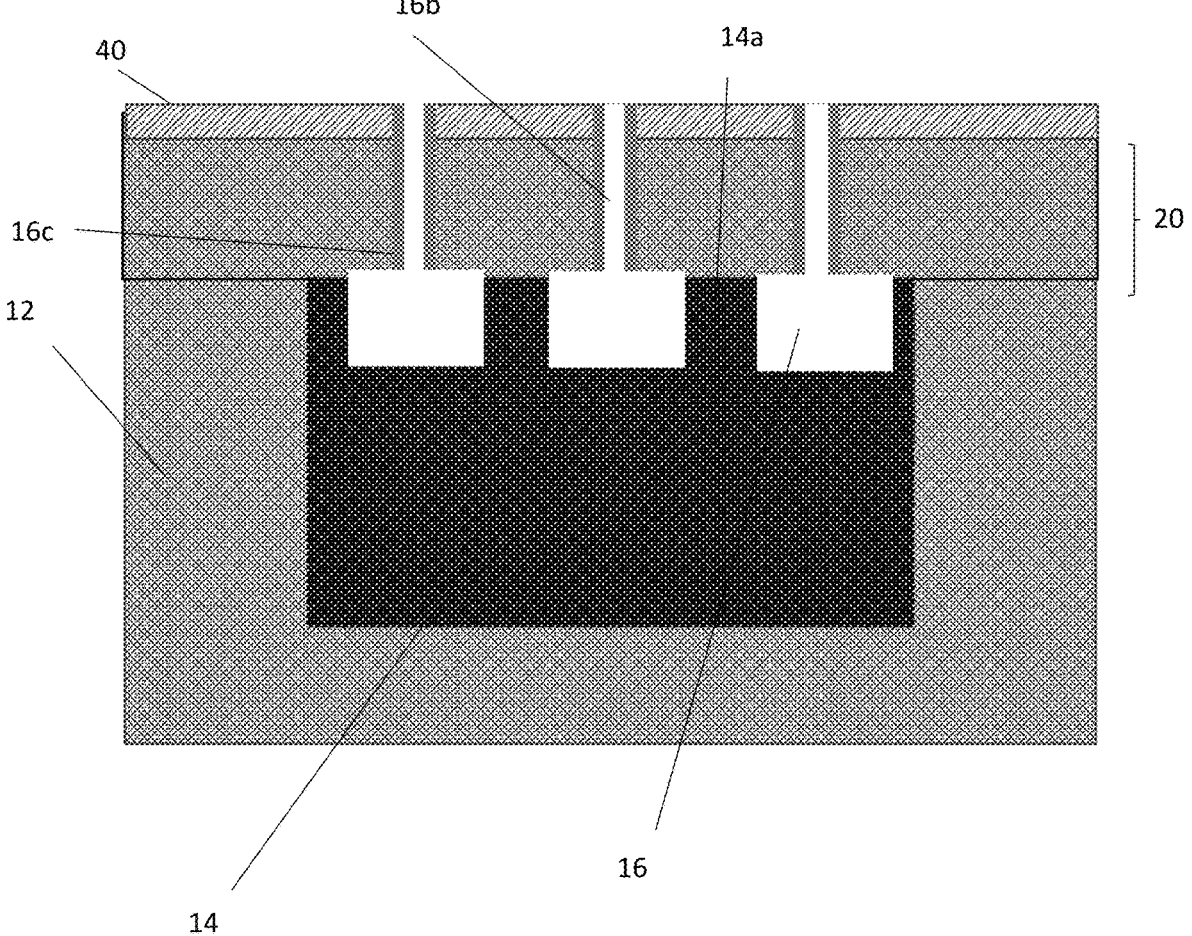

In FIG. 4B, airgap structures 16 may be formed in the trap-rich region 14. It should be understood by those of ordinary skill in the art that other implementations are also contemplated herein, which can be fabricated in similar processes. For example, the airgap structures 16 may be formed above the trap-rich region 14. Similarly, one airgap structure may be formed within or above the trap-rich region 14.

In any configuration to form the airgap structures 16, a pad layer 40, e.g., pad nitride and/or oxide, may be formed over the semiconductor material 20. One or more trenches 16b may be formed in the substrate 12 and, in this implementation, extend to the trap-rich region 14. In embodiments, the one or more trenches 16b may be formed by conventional lithography and etching processes as described herein. A thermal oxidation process, CVD process or atomic layer deposition (ALD) process may be performed to form a dielectric liner 16c on sidewalls of the one or more trenches 16b. Any dielectric material on the bottom of the trenches may be removed by an anisotropic etch, e.g., RIE using a perfluorocarbon-based chemistry, as is known in the art.

The airgap structures 16 may be formed through the one or more trenches 16b using an etching process with a selective chemistry to the substrate 12, e.g., silicon etching process through the bottom of the trenches 16b. In embodiments, the exposed substrate material of the substrate 12 may be removed by a wet etching process or dry etching process. For example, dry etchants can include plasma-based $CF_4$, plasma-based $SF_6$, or gas $XeF_4$ silicon etch, etc. and wet etching processes can include KOH and $NH_4OH$. In embodiments, the airgap structures 16 are formed in the trap-rich region 14; however, it may also be formed above the trap-rich region 14 as shown in FIGS. 2 and 3. Also, depending on the etch time, the airgap structures 16 may be plural airgap structures 16 separated by the pillar 14a or, alternatively, with a longer etch time, the airgap structures 16 can merge to form a single, larger airgap structure. Additionally, it is also contemplated to have a single airgap structure formed using one or more trenches 16b, directly under the emitter as shown in FIG. 3.

Figure 4C:
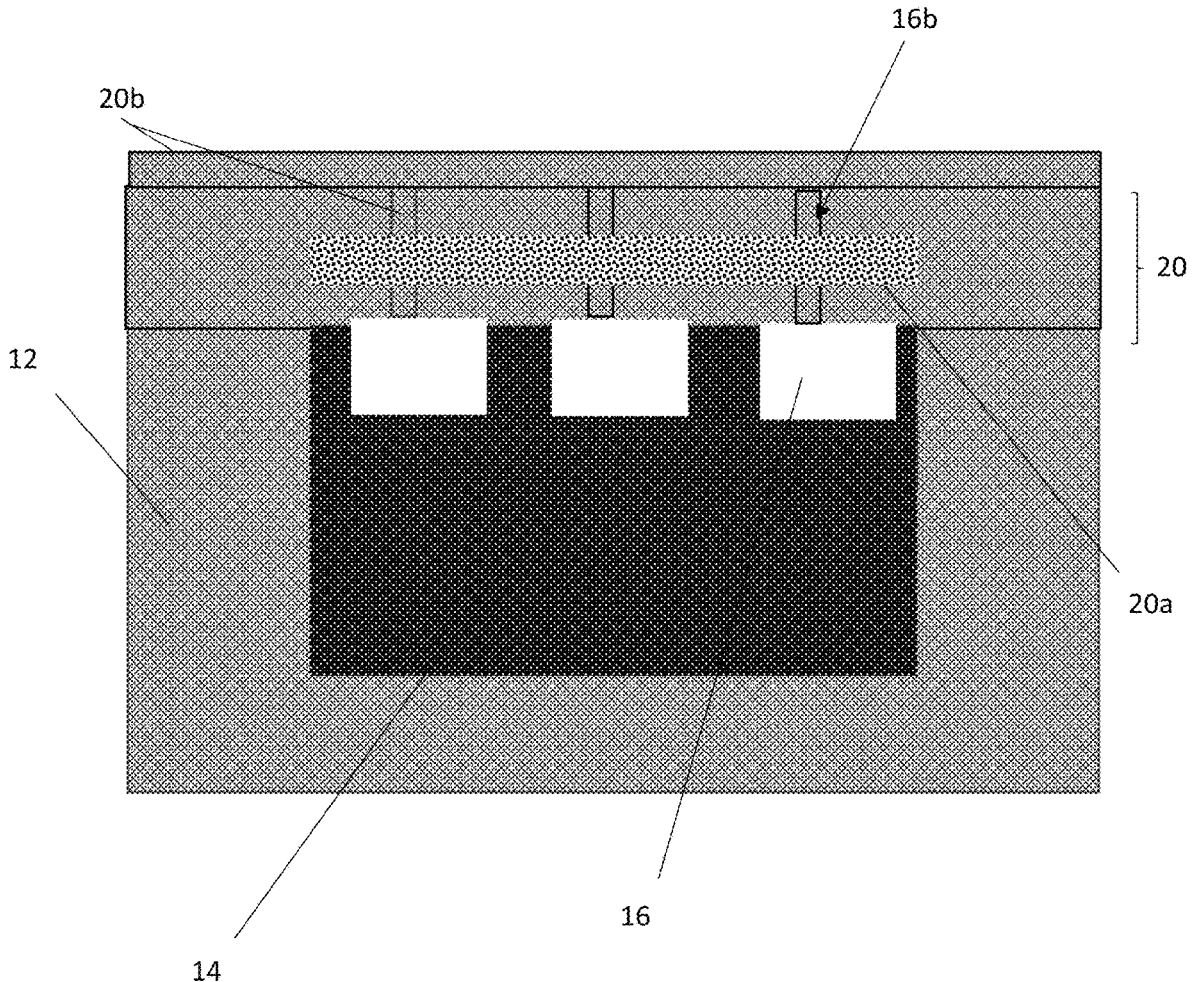

In FIG. 4C, the liner material may be removed from within the trenches 16b. In addition, the pad material can be removed from the surface of the structure. The liner material and the pad material may be removed by conventional etching process. For example, the liner material may be removed using a RIE with a selective chemistry. The pad material may be removed by an etching process or, alternatively, a chemical mechanical polishing (CMP) process. Following such removal of material, the trenches 16b may be sealed with additional semiconductor material 20b, e.g., Si or SiGe, to plug the one or more airgap structures 16. The semiconductor material 20b may be an epitaxial grown semiconductor material which seals or plugs the one or more airgap structures 16 in the trap-rich region 14.

Following the sealing of the one or more airgap structures 16 with the additional epitaxial material 20b, the N+ doped region 20a may be formed by introducing a dopant by, for example, ion implantation. In embodiments, a patterned implantation mask may be used to define selected areas exposed for the implantation, e.g., the N+ doped region 20a. The implantation mask may include a layer of a light-sensitive material, such as an organic photoresist, applied by a spin coating process, pre-baked, exposed to light projected through a photomask, baked after exposure, and developed with a chemical developer. Each of the implantation masks has a thickness and stopping power sufficient to block masked areas against receiving a dose of the implanted ions.

The N+ doped region 20a may be doped with n-type dopants, e.g., Arsenic (As), Phosphorus (P) and Sb, among other suitable examples.

Figure 4D:
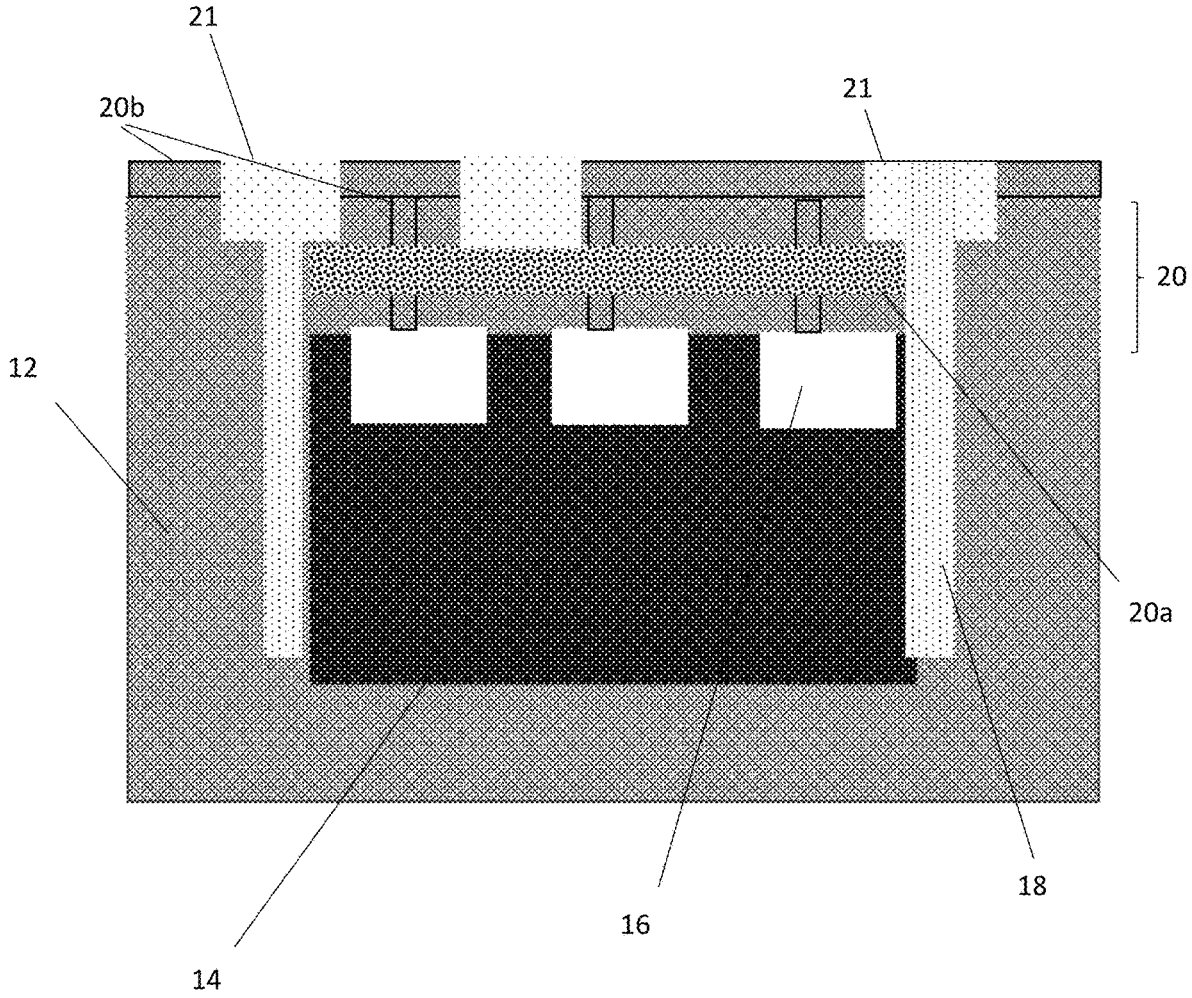

Referring to FIG. 4D, the deep trench isolation structures 18 and shallow trench isolation structures 21 are formed in the substrate 12 and semiconductor material 20, respectively. In embodiments, the deep trench isolation structures 18 and shallow trench isolation structures 21 may be formed before or after formation of the airgap structures 16. Also, as noted herein, the deep trench isolation structures 18 bound (e.g., surround) the one or more airgap structures 16 and the trap-rich region 14. In embodiments, the trap-rich region 14 may extend below the deep trench isolation structures 18.

The deep trench isolation structures 18 and the shallow trench isolation structures 21 can be formed by conventional lithography, etching and deposition methods known to those of skill in the art. For example, a resist formed over the semiconductor material 20 is exposed to energy (light) to form a pattern (opening). For the deep trench isolation structures 18, an etching process with a selective chemistry, e.g., reactive ion etching (RIE), will be used to transfer the pattern from the resist layer to the semiconductor material 20 and substrate 12 to form one or more trenches in these layers 12, 20. For the shallow trench isolation structures 21, the etching process, e.g., RIE, will be used to transfer the pattern from the resist layer to the semiconductor material 20, 20b to form one or more trenches in the semiconductor material 20, 20b. Following the resist removal by a conventional oxygen ashing process or other known stripants, the insulator material can be deposited by any conventional deposition processes, e.g., chemical vapor deposition (CVD) processes. Any residual material on the surface of the semiconductor material 20 can be removed by conventional chemical mechanical polishing (CMP) processes.

Figure 4E:
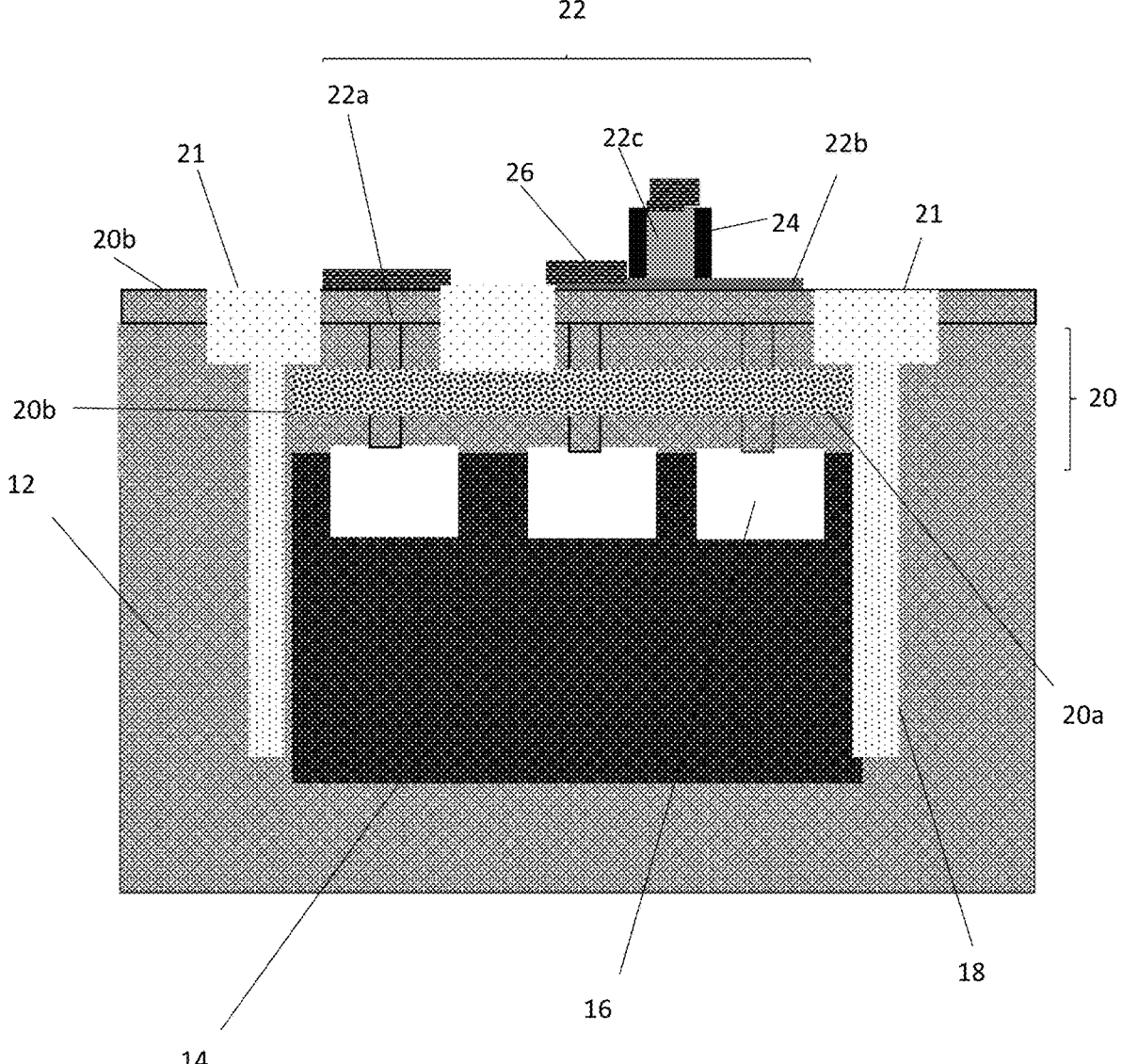

In FIG. 4E, the device 22 may be formed over the one or more airgap structures 16 and the trap-rich region 14. In this implementation, the device 22 may be a heterojunction bipolar transistor; however, other active or passive devices over the one or more airgap structures 16 and the trap-rich region 14 are contemplated herein. In the heterojunction bipolar transistor, the collector 22a may be provided with the semiconductor material 20, 20b, above and connecting to the N+ doped region 20a. The base 22b may be formed over the semiconductor material 20 (and 20b) using an epitaxial growth process as is known in the art. In embodiments, the base 22b may comprise SiGe material. The emitter 22c may be formed on the base 22b using CVD processes with an in-situ doping, e.g., n-type dopants, followed by a patterning process, e.g., lithography and etching. The sidewall spacers 24 may be nitride and/or oxide material formed by conventional deposition processes (e.g., CVD) followed by an anisotropic etching process as is known in the art.

The silicide contacts 26 may be formed on the collector 22a, base 22b and emitter 22c. As should be understood by those of skill in the art, the silicide process begins with deposition of a thin transition metal layer, e.g., nickel, cobalt or titanium, over fully formed and patterned semiconductor devices (e.g., collector 22a, base 22b and emitter 22c). After deposition of the material, the structure is heated allowing the transition metal to react with exposed silicon (or other semiconductor material as described herein) forming a low-resistance transition metal silicide contacts 26. Following the reaction, any remaining transition metal is removed by chemical etching, leaving the silicide contacts 26.

The devices can be utilized in system on chip (SoC) technology. It should be understood by those of skill in the art that SoC is an integrated circuit (also known as a "chip")

that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a semiconductor substrate comprising a trap-rich region;
   plural airgap structures within the semiconductor substrate, wherein the plural airgap structures are within the trap-rich region;
   at least one deep trench isolation structure laterally surrounding the plural airgap structures and extending into the semiconductor substrate, wherein the plural airgap structures are bounded by the at least one deep trench structure and isolated from one another by pillars comprising the trap-rich region; and
   a device over the plural airgap structures.

2. The structure of claim 1, wherein the at least one airgap structure is within the trap-rich region below the device.

3. The structure of claim 1, wherein the device is a heterojunction bipolar transistor comprising a collector, a base and an emitter.

4. The structure of claim 1, wherein the trap-rich region comprises amorphous semiconductor material below the device.

5. The structure of claim 4, wherein the trap-rich region extends at least partially below the at least one deep trench isolation structure within the semiconductor substrate.

6. The structure of claim 1, further comprising epitaxial semiconductor material that seals the plural airgap structures.

7. The structure of claim 1, further comprising shallow trench isolation structures above the trap-rich region.

8. A structure comprising:
   a semiconductor substrate comprising a trap-rich region of amorphous semiconductor material;
   shallow trench isolation structures above the trap-rich region;
   deep trench isolation structures extending into the semiconductor substrate to a depth below the shallow trench isolation structures;
   plural airgap structures bounded by the deep trench isolation structures and isolated from one another by pillars comprising the trap-rich region, wherein the plural airgap structures are within the trap-rich region; and
   a device above the plural airgap structures and the trap rich region.

9. The structure of claim 8, wherein the at least one airgap structure is within the trap-rich region below the device.

10. The structure of claim 8, wherein the device is a heterojunction bipolar transistor comprising a collector, a base and an emitter.

11. The structure of claim 8, wherein the trap-rich region is also bounded by the deep trench isolation structures.

12. The structure of claim 8, wherein the trap-rich region extends at least partially below the deep trench isolation structures.

13. The structure of claim 8, further comprising epitaxial semiconductor material that seals the plural airgap structures.

14. A method comprising:
   forming a semiconductor substrate comprising a trap-rich region;
   forming plural airgap structures within the semiconductor substrate, wherein the plural airgap structures are within the trap-rich region;
   forming at least one deep trench isolation structure laterally surrounding the plural airgap structures and extending into the semiconductor substrate, wherein the plural airgap structures are bounded by the at least one deep trench structure and isolated from one another by pillars comprising the trap-rich region; and
   forming a device over the plural airgap structures.

* * * * *